United States Patent [19]

Kumanoya et al.

[11] Patent Number: 4,710,901

[45] Date of Patent: Dec. 1, 1987

[54] DRIVING CIRCUIT FOR A SHARED SENSE AMPLIFIER

[75] Inventors: Masaki Kumanoya; Kazuyasu Fujishima; Katsumi Dosaka, all of Itami, Japan

[73] Assignee: Mitsubishi Denki Kabushiki Kaisha, Tokyo, Japan

[21] Appl. No.: 767,193

[22] Filed: Aug. 19, 1985

[30] Foreign Application Priority Data

Aug. 17, 1984 [JP] Japan ................................. 59-172005

[51] Int. Cl.$^4$ ................................................ G11C 7/00
[52] U.S. Cl. .................................... 365/190; 365/205; 365/233
[58] Field of Search ............... 365/189, 190, 205, 207, 365/208, 203, 210, 149, 233; 307/530

[56] References Cited

U.S. PATENT DOCUMENTS

| | | | |
|---|---|---|---|
| 4,061,954 | 12/1977 | Proebsting et al. | 365/203 |
| 4,233,675 | 11/1980 | Karp et al. | 365/205 |
| 4,262,341 | 4/1981 | Mogi et al. | 365/205 |
| 4,363,111 | 12/1982 | Heightley et al. | 365/205 |
| 4,387,448 | 6/1983 | Takemae et al. | 365/203 |
| 4,606,010 | 8/1986 | Saito | 365/210 |

FOREIGN PATENT DOCUMENTS 57-92486  6/1982  Japan .
59-95728  6/1984  Japan .

OTHER PUBLICATIONS

Smith et al., IEEE Journal of Solid-State Circuits, vol. SC-15, No. 2, Apr. 1980, pp. 184–189.
Barnes et al., IEEE Journal of Solid-State Circuits, vol. SC-15, No. 5, Oct. 1980, pp. 831–839.

Primary Examiner—Stuart N. Hecker
Assistant Examiner—Glenn A. Gossage
Attorney, Agent, or Firm—Lowe, Price, LeBlanc, Becker & Shur

[57] ABSTRACT

When any one of memory cells ($MC_{1R}$, $MC_{NR}$ and $MC_{1L}$, $MC_{NL}$) connected with respective bit lines ($3_R$, $4_R$ and $3_L$, $4_L$) is addressed, the gate potential of a transfer transistor group ($7_R$, $8_R$ or $7_L$, $8_L$) connected with the bit lines on the non-selected side is clamped at bit line precharge voltage, whereby the said transfer transistor group ($7_R$, $8_R$ or $7_L$, $7_L$) is turned off. Thus, the bit lines on the non-selected side are cut off at a high speed from a sense amplifier.

10 Claims, 11 Drawing Figures

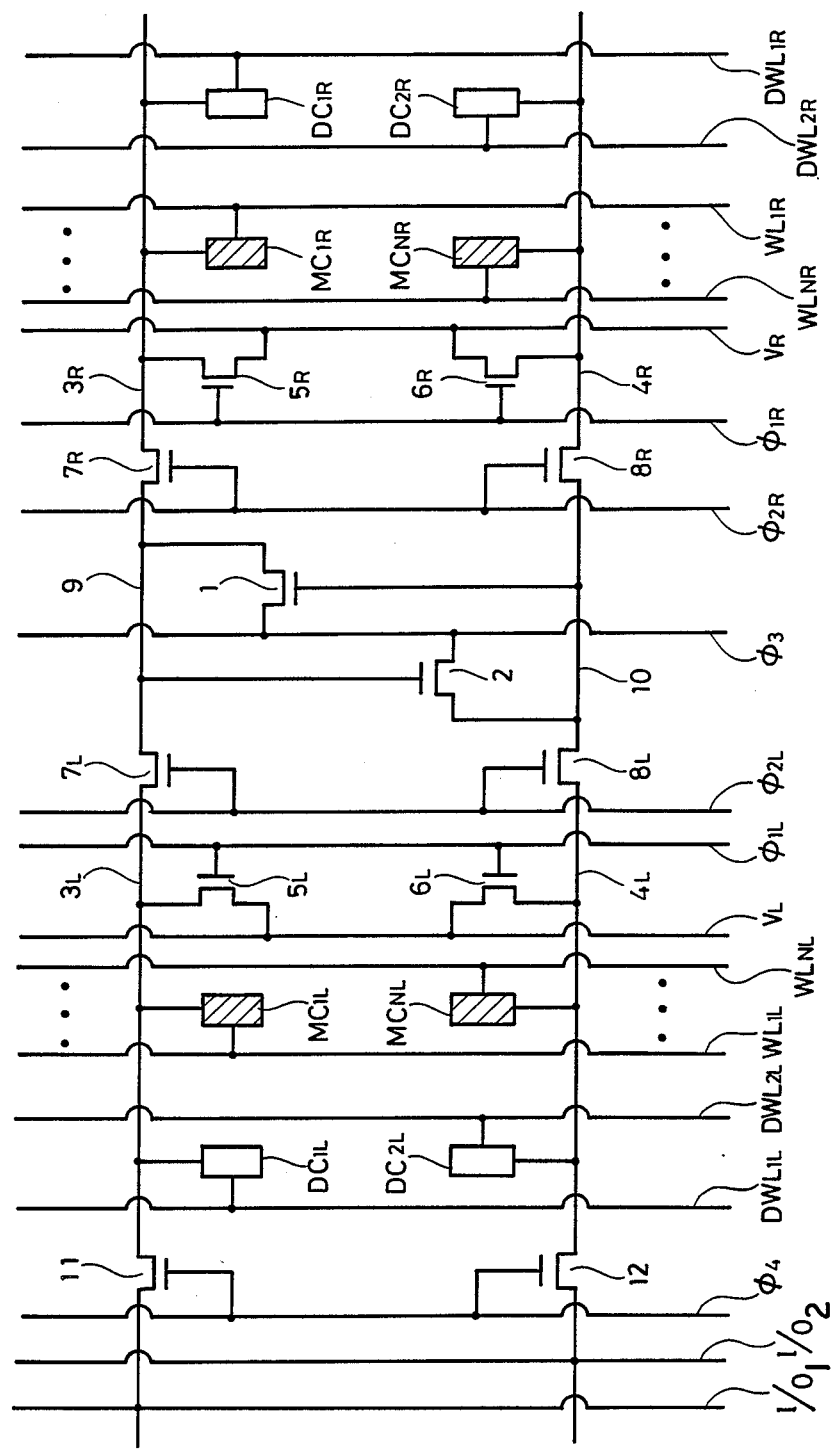
F I G. 1

DRIVING CIRCUIT FOR A SHARED SENSE AMPLIFIER

BACKGROUND OF THE INVENTION

1. Field of the Invention

The present invention relates to a driving circuit for a shared sense amplifier, and more particularly, it relates to a circuit for driving a sense amplifier shared by two pairs of folded bit lines or open bit lines at a high speed.

2. Description of the Prior Art

FIG. 1 shows an example of a shared sense amplifier to which the present invention can be applied. In FIG. 1, a clock $\phi_3$ is supplied to respective sources of transistors 1 and 2. The drain of the transistor 1 is connected to a sense node 9 while the gate thereof is connected to a sense node 10. On the other hand, the drain of the transistor 2 is connected to the sense node 10 while the gate thereof is connected to the sense node 9. These transistors 1 and 2 form a flip-flop type sense amplifier.

The sense node 9 is connected to a bit line $3_R$ through a transfer transistor $7_R$ and to a bit line $3_L$ through a transfer transistor $7_L$. The sense node 10 is connected to a bit line $4_R$ through a transfer transistor $8_R$ and to a bit line $4_L$ through a transfer transistor $8_L$. The transfer transistors $7_R$ and $8_R$ are adapted to connect and cut off the bit lines $3_R$ and $4_R$ on the right side with and from the sense amplifier, and are on-off controlled by a control clock $\phi_{2R}$. Similarly, the transfer transistors $7_L$ and $8_L$ are adapted to connect and cut off the bit lines $3_L$ and $4_L$ on the left side with and from the sense amplifier, and are on-off controlled by a control clock $\phi_{2L}$. The bit lines $3_R$ and $4_R$ form a pair of folded bit lines while the bit lines $3_L$ and $4_L$ similarly form another pair of folded bit lines. In the shared sense amplifier circuit as shown in FIG. 1, the sense amplifier, which is formed by the transistors 1 and 2, is shared by the two pairs of folded bit lines.

The bit lines $3_R$ and $4_R$ on the right side of FIG. 1 are respectively connected with sources of transistors $5_R$ and $6_R$. Precharge voltage $V_R$ is applied to respective drains of the transistors $5_R$ and $6_R$ while a precharge clock $\phi_{1R}$ is supplied to respective gates thereof. These transistors $5_R$ and $6_R$ are adapted to charge the bit lines $3_R$ and $4_R$ at the precharge voltage $V_R$ in response to the precharge clock $\phi_{1R}$ respectively. The bit lines $3_R$ and $4_R$ are further connected with memory cells $MC_{1R}$ and $MC_{NR}$ respectively. The storage content of the memory cell $MC_{1R}$ is read on the bit line $3_R$ when a word line $WL_{1R}$ is selected while the storage content of the memory cell $MC_{NR}$ is read on the bit line $4_R$ when a word line $WL_{NR}$ is selected. The bit lines $3_R$ and $4_R$ are further connected with dummy memory cells $DC_{1R}$ and $DC_{2R}$. With respect to the dummy memory cell $DC_{1R}$, intermediate potential between read out potential of information "0" and that of information "1" is read on the bit line $3_R$ when a dummy word line $DWL_{1R}$ is selected, while the said intermediate potential is read on the bit line $4_R$ when a dummy word line $DWL_{2R}$ is selected with respect to the dummy memory cell $DC_{2R}$.

Elements similar to those connected with the bit lines $3_R$ and $4_R$ are connected with the bit lines $3_L$ and $4_L$ in the left-hand direction. The elements corresponding to the aforementioned ones are indicated by the same reference numerals, except for that the subscripts "R" are replaced by "L", and detailed description thereof is herein omitted.

The bit lines $3_L$ and $4_L$ on the left side are connected with read/write lines $I/O_1$ and $I/O_2$ respectively through transfer transistors 11 and 12. A clock $\phi_4$ is supplied to respective gates of the transfer transistors 11 and 12.

Although merely four word lines $WL_{1R}$, $WL_{NR}$, $WL_{1L}$ and $WL_{NL}$ are shown in FIG. 1, a number N (arbitrarily selected even number) of word lines are present on each side in practice while of the corresponding number N of memory cells $MC_{1R}$ ($MC_{1L}$) to $MC_{NR}$ ($MC_{NL}$), N/2 are connected with the bit lines $3_R$ ($3_L$) and $4_R$ ($4_L$), respectively.

Although the circuit as shown in FIG. 1 employs only one sense amplifier, a practical memory is generally formed by a plurality of sense amplifiers which are vertically aligned to form arrays of memory cells.

Description is now made on a circuit having one sense amplifier and two word lines, for easy understanding of the present invention.

FIG. 2 is a timing chart of an NMOS employed for illustrating the operation of the circuit as shown in FIG. 1.

In a standby state to a time $T_1$, the precharge clock $\phi_{1L}$ is at a high level, whereby the transistors $5_L$ and $6_L$ are in ON states and the bit lines $3_L$ and $4_L$ are charged at the precharge voltage $V_L$. The precharge clock $\phi_{1R}$ is also at a high level, whereby the bit lines $3_R$ and $4_R$ are charged at the precharge voltage $V_R$ through the transistors $5_R$ and $6_R$. During this period, the clock $\phi_3$ for inactivating the sense amplifier is at a high level, whereby the sense amplifier is retained in the standby state. Assuming here that either of the memory cells $MC_{1R}$ and $MC_{NR}$ on the right side of the sense amplifier is addressed by address data (not shown), the potential of either word line $WL_{1R}$ or $WL_{NR}$ and that of either dummy word line $DWL_{1R}$ or $DWL_{2R}$ are increased, while the non-selected word line $WL_{1L}$ or $WL_{NL}$ and dummy word line $DWL_{1L}$ or $DWL_{2L}$ remain at low levels.

The potential levels at the selected word line and dummy word line are not immediately increased upon the addressing performed by the address data. This is because the address data are supplied to a decoder (not shown), which increases the potential levels at the selected word line and dummy word line, whereby the increase in the potential levels of the word line and dummy word line is delayed from the addressing by the time required for processing in the decoder.

Description is now made on the case where, for example, the word line $WL_{1R}$ and dummy word line $DWL_{2R}$ are selected.

Upon input of the address data, the control clock $\phi_{2L}$ is turned to a low level at a time $T_2$ before increase of the potential levels at the word line $WL_{1R}$ and dummy word line $DWL_{2R}$, whereby the transfer transistors $7_L$ and $8_L$ are both made nonconductive. Thus, the sense nodes 9 and 10 are electrically cut off from the bit lines $3_L$ and $4_L$, and the potential levels at the word line $WL_{1R}$ and dummy word line $DWL_{2R}$ are increased at a time $T_3$. Then, information stored in the memory cell $MC_{1R}$ is read on the bit line $3_R$ and the charge stored in the dummy memory cell $DC_{2R}$ is read on the bit line $4_R$ respectively. The read information is transferred to the sense nodes 9 and 10 through the transfer transistors $7_R$ and $8_R$ during the period when the control clock $\phi_{2R}$ is at a high level to a time $T_4$. The level of the control clock $\phi_{2R}$ slightly drops at the time $T_4$ while impedance levels of the transfer transistors $7_R$ and $8_R$ are increased.

When the clock $\phi_3$ is turned to a low level at a time $T_5$, the sense amplifier formed by the transistors 1 and 2 is activated and the information transferred to the sense nodes 9 and 10 is amplified. The amplified information is returned to the bit lines $3_R$ and $4_R$ respectively through the transfer transistors $7_R$ and $8_R$, to be re-written in the memory cell being selected. The control clock $\phi_{2L}$ is again turned to a high level at a time $T_6$, whereby the amplified information is transferred to the bit lines $3_L$ and $4_L$ through the transfer transistors $7_L$ and $8_L$.

The clock $\phi_4$ is turned to a high level at a time $T_7$, and the amplified information is transferred to the read/write lines $I/O_1$ and $I/O_2$ through the transfer transistors 11 and 12. The word line $WL_{1R}$, dummy word line $DWL_{2R}$ and clock $\phi_4$ return to low levels at a time $T_8$ and the clocks $\phi_{1R}$, $\phi_{1L}$, $\phi_3$ and $\phi_{2R}$ are turned to high levels at a time $T_9$, whereby the folded bit lines on both sides are charged at $V_R$ and $V_L$ respectively, and the sense amplifier returns to a standby state.

The sequential read/write operation is performed in the aforementioned manner. The impedance levels of the transfer transistors $7_R$ and $8_R$ are so increased in amplification of the sense amplifier as to reduce capacity loads at the sense nodes 9 and 10 thereby to increase amplification sensitivity.

When the memory cells $MC_{1L}$ and $MC_{NL}$ on the left side are selected, the waveforms of the control clocks $\phi_{2L}$ and $\phi_{2R}$ change places with each other.

As hereinabove described, the sense amplifier as shown in FIG. 1 is driven to be shared by two pairs of folded bit lines.

As obvious from the foregoing description, the waveforms of the control clocks $\phi_{2R}$ and $\phi_{2L}$ have important functions for driving the shared sense amplifier. Particularly the control clock on the non-selected side ($\phi_{2L}$ in the above case) must be immediately turned to a low level before the potential levels at the selected word lines rise upon the addressing of the memory cells by the address data, i.e., before read-out of the memory cells, to cut off the non-selected bit lines from the sense amplifier. Slow fall of the control clock on the non-selected side delays the read-out from the memory cells, whereby high-speed read-out is disabled. The slow fall of the control clock further delays transfer of the information amplified by the sense amplifier to the read-/write lines $I/O_1$ and $I/O_2$, whereby the high-speed read-out is disabled. Thus, there is needed an implementation of a driving circuit for a shared sense amplifier which can attain high-speed read-out operation by quickly connecting and cutting off bit lines with and from the sense amplifier.

SUMMARY OF THE INVENTION

An object of the present invention is to provide a driving circuit for a sense amplifier shared by two pairs of bit lines which can connect and cut off the bit lines with and from the sense amplifier at a high speed thereby to drive the shared sense amplifier at a high speed.

Briefly stated, the present invention provides a circuit for driving at a high speed a shared sense amplifier including two pairs of bit lines respectively connected with memory cells, a sense amplifier positioned between the two pairs of bit lines for amplifying information read from the memory cells, a first transfer transistor group interposed between one of the pairs of bit lines and the sense amplifier and a second transfer transistor group interposed between the other pair of bit lines and the sense amplifier thereby to share the sense amplifier by the two pairs of bit lines, and the driving circuit comprises a clamp clock generation circuit, a decoder and an on-off control means. The clamp clock generation circuit is adapted to generate a clamp clock which responds at a high speed to addressing of the memory cells, and the decoder is adapted to decode the clamp clock from the clamp clock generation circuit while the on-off control means is adapted to control on-off operations of the first and second transfer transistor groups on the basis of the output from the decoder. The on-off control means includes a clamp means for clamping upon addressing of either of the memory cells the gate potential of the transfer transistor group interposed between the bit lines in the area not connected with the addressed memory cell and the sense amplifier at bit line precharge voltage thereby to turn off the said transfer transistor group.

Generated according to the present invention is the clamp clock which responds at a high speed to the addressing to produce a control clock from the clamp clock, thereby to control on-off operations of the first and second transfer transistor groups by the control clock, and hence the bit lines on the non-selected side can be cut off from the sense amplifier immediately upon the addressing of the memory cell. In order to turn off the first or second transfer transistor group, the gate voltage at the transfer transistor group is not completely turned to a low level but clamped at the bit line precharge voltage, whereby the time required for cutting off the transfer transistor group can be reduced in comparison with the case where the gate voltage thereof is completely turned to a low level, and the cut off operation can be performed at a higher speed. Therefore, even if the time interval from the addressing of the memory cell to actual readout of the information in the memory cell is extremely short, the bit lines on the non-selected side can reliably be cut off from the sense amplifier within the short interval, thereby to attain high-speed driving of the shared sense amplifier.

Further, the gate voltage of the transfer transistor group is clamped at the bit line precharge voltage as hereinabove described so that the said transfer transistor group is automatically turned on by the amplification function of the sense amplifier to re-connect the bit lines on the non-selected side with the sense amplifier, and hence such re-connection can be performed at a higher speed in comparison with the case where voltage is applied to the gate of the transfer transistor group after the operation of the sense amplifier to re-connect the bit lines on the non-selected side with the sense amplifier. Therefore, the content of the memory cell can be externally read immediately after termination of the operation of the sense amplifier, thereby to attain high-speed readout operation.

The above and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing an example of a shared sense amplifier to which the present invention can be applied;

DESCRIPTION OF THE PREFERRED EMBODIMENTS

Figure 2:
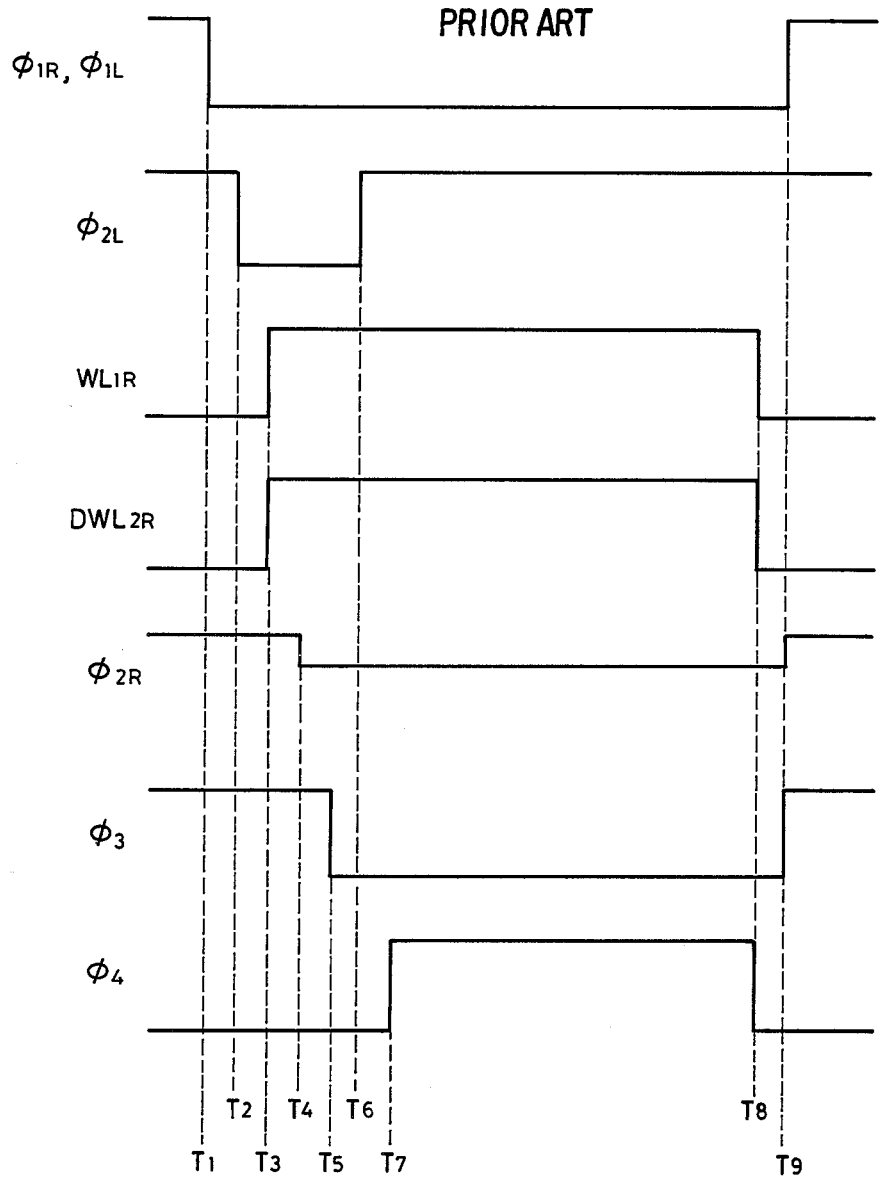
FIG. 2 is a timing chart for illustrating the general operation for driving the circuit as shown in FIG. 1.
Figure 3:
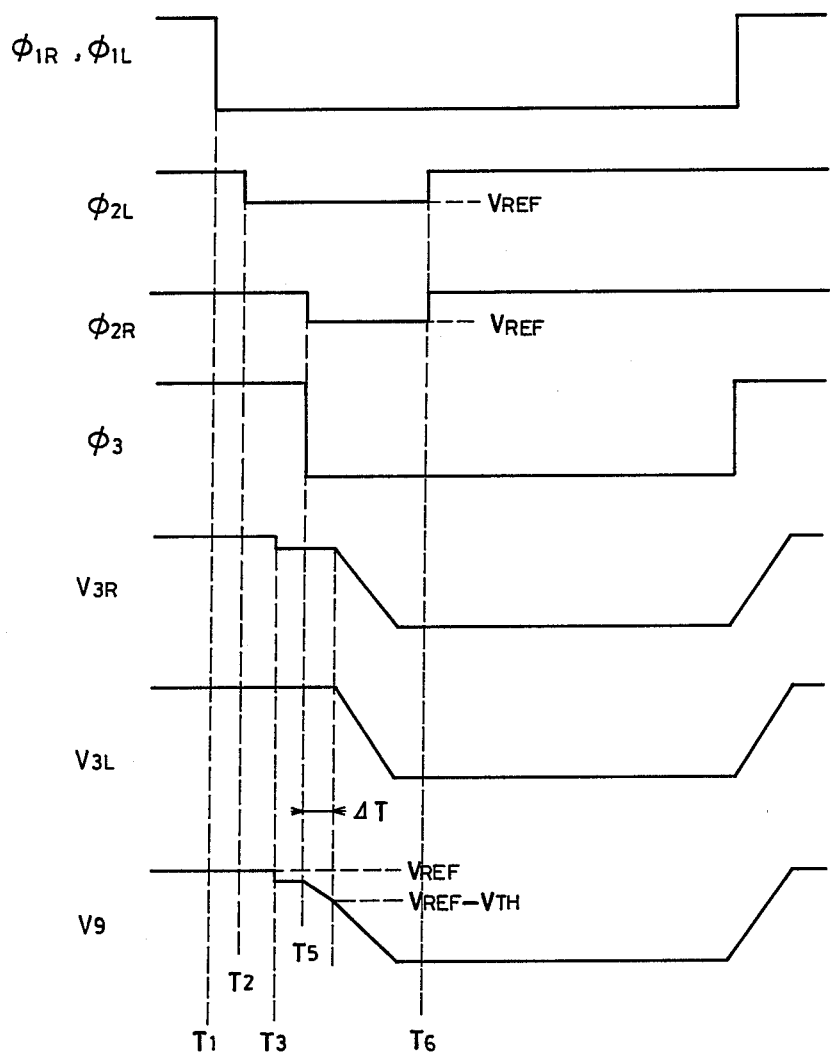
FIG. 3 is a timing chart for illustrating the driving operation according to an embodiment of the present invention.

FIG. 3 is a timing chart for illustrating the operation performed by an embodiment of the present invention for driving a shared sense amplifier. The basic circuit structure of the shared sense amplifier may be identical to that shown in FIG. 1. In a standby state, precharge clocks $\phi_{1L}$ and $\phi_{1R}$ are both at high levels and hence bit lines $3_R$, $4_R$, $3_L$ and $4_L$ are charged respectively at precharge voltage levels $V_R$ and $V_L$. The voltage levels $V_R$ and $V_L$ are generally set equal to each other, and hence they are hereafter indicated as $V_{REF}$. At this time, the levels of control clocks $\phi_{2L}$ and $\phi_{2R}$ are set higher than the total of the bit line precharge voltage $V_{REF}$ and threshold voltage of transfer transistors. Therefore, all of the transfer transistors $7_L$, $8_L$, $7_R$ and $8_R$ are in ON states whereby sense nodes 9 and 10 are precharged at $V_{REF}$. The feature of this driving method resides in that the level of a control clock 100 $_{2L}$ on the non-selected side is not completely turned to a low level, but clamped at the bit line precharge voltage $V_{REF}$ before rise of corresponding word lines upon addressing of memory cells. In other words, the bit lines $3_R$, $3_L$, $4_R$ and $4_L$ and sense nodes 9 and 10 are at the potential level of $V_{REF}$, and hence the transfer transistors $7_L$ and $8_L$ are cut off with drains, sources and gates being at the same level by clamping the control clock $\phi_{2L}$ at $V_{REF}$. As a matter of course, such cut-off operation can be performed by clamping the level of the control clock $\phi_{2L}$ at $V_{REF}$ at a higher speed than the case where the same is turned to a low level.

For example, when a memory cell $MC_{1R}$ storing low level charge is addressed, the operation is performed in the following manner: In FIG. 3, symbols $V_{3R}$ and $V_{3L}$ indicate potential levels at the bit lines $3_R$ and $3_L$ respectively, while symbol $V_9$ indicates the potential level at the sense node 9. At a time $T_1$, precharge clocks $\phi_{1R}$ and $\phi_{1L}$ are turned to low levels, while the potential levels $V_{3R}$ and $V_{3L}$ remain at $V_{REF}$. At a time $T_2$, the control clock $\phi_{2L}$ is clamped at $V_{REF}$, whereby the transfer transistors $7_L$ and $8_L$ are turned off as hereinabove described and the bit line $3_L$ is electrically cut off from the sense node 9. On the other hand, the control clock $\phi_{2R}$ remains at a high level, whereby the bit line $3_R$ remains connected with the sense node 9. At a time $T_3$, the potential at a word line $WL_{1R}$ is increased and the information in the memory cell $MC_{1R}$ is read on the bit line $3_R$. At this time, the potential $V_{3R}$ at the bit line $3_R$ is slightly lowered by a level determined by the capacitance ratio of the memory cell $MC_{1R}$ to the bit line $3_R$. The potential at the sense node 9 is slightly lowered in response to this, whereas the transfer transistor $7_L$ is not turned on since the decreased level is generally smaller than a threshold voltage $V_{TH}$ of the transistors. At a time $T_5$, the clock $\phi_3$ is turned to a low level thereby to activate the sense amplifier, and the potential level $V_9$ at the sense node 9 begins to be lowered. At this time, the control clock $\phi_{2R}$ is lowered to $V_{REF}$ and the bit line $3_R$ is temporarily cut off from the sense node 9, whereby the capacitive load is reduced and the amplification sensitivity is improved. After a lapse of a time $\Delta T$ from the time $T_5$, the potential level $V_9$ reduced to $(V_{REF}-V_{TH})$, whereby the transfer transistors $7_L$ and $7_R$ begin to enter ON states and the bit lines $3_L$ and $3_R$ are automatically re-connected with the sense node 9. Thereafter the control clocks $\phi_{2R}$ and $\phi_{2L}$ are turned to high levels, i.e., levels higher than $V_{REF}$ at a time $T_6$, whereby the transfer transistors $7_R$ and $7_L$ are increased in conductivity. Therefore, the information read from the memory cell is sufficiently transmitted to read/write lines in the read-out operation.

As hereinabove described, the bit lines on the non-selected side are cut off from the sense amplifier by clamping the gate voltage of the transfer transistors on the non-selected side at the bit line precharge voltage before rise of potential levels at the word lines upon addressing of the memory cell in the aforementioned operation, whereby attained is a cut-off operation at a higher speed than the case where the gate voltage levels at the transfer transistors are completely turned to low levels. Further, the gate voltage levels at the transfer transistors are so clamped at the bit line precharge voltage level that the transfer transistors are automatically turned on by the amplification function of the sense amplifier and the bit lines on the non-selected side are automatically re-connected with the sense amplifier, whereby the time required for the re-connection of the bit lines on the non-selected side is extremely reduced. Therefore, the content of the memory cell can be outputted to the exterior immediately after the amplification by the sense amplifier, thereby to enable high-speed readout operation. Further, the gate voltage levels at the transfer transistors are made to be higher than the total of the bit line precharge voltage and the threshold voltage levels of the transfer transistors for reading the content of the memory cell to attain a sufficient read-out level in the aforementioned embodiment, and the rise of the gate voltage in this case can be performed in a shorter period than that in the case where the gate voltage levels of the transfer transistors are completely turned to low levels to be then turned to high levels. Thus, such a point also contributes to the high-speed read-out operation.

Description is now made of an example of structure of a driving circuit required for attaining the operation as shown in FIG. 3. In the following description, the bit line precharge voltage $V_{REF}$ is assumed to be equal to supply voltage $V_{CC}$.

Figure 4:
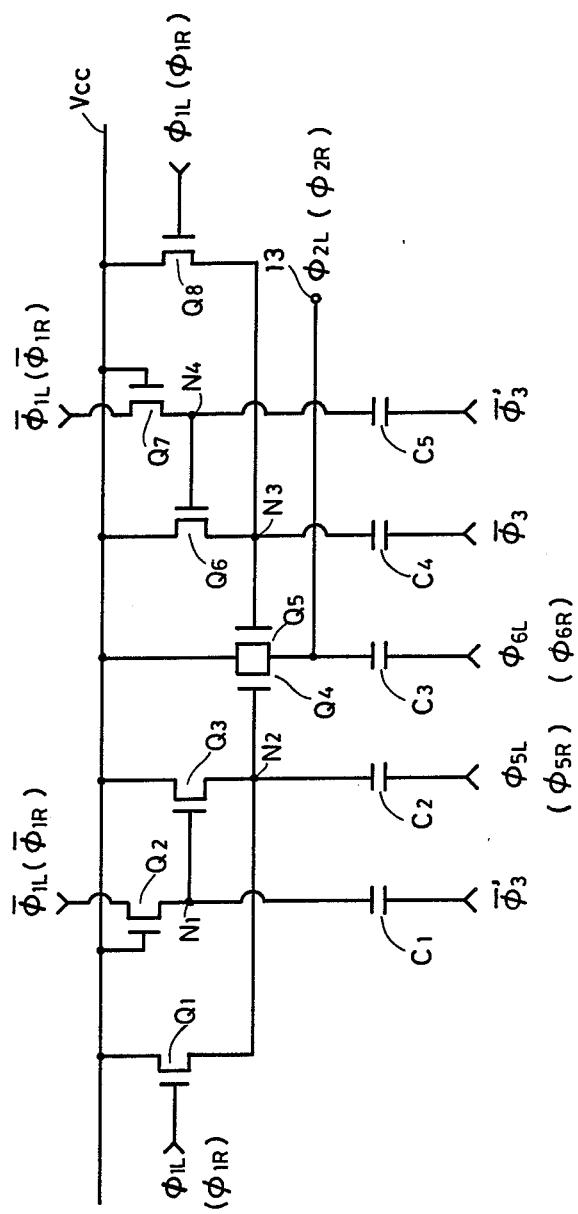
FIG. 4 is a circuit diagram showing a part of the embodiment of the present invention, particularly a circuit for generating control clocks.

FIG. 4 shows a circuit for generating the control clock $\phi_{2L}$ as shown in FIG. 3. The circuit as shown in FIG. 4 includes transistors $Q_1$ to $Q_8$ and capacitors $C_1$ to $C_5$. The drain of the transistor $Q_1$ receives the supply voltage $V_{CC}$ and the gate receives the precharge clock $\phi_{1L}$ while the source is connected to a node $N_2$. The drain of the transistor $Q_2$ receives an inverted precharge clock $\overline{\phi}_{1L}$ which is an inverted signal of the precharge clock $\phi_{1L}$, while the gate receives the supply voltage $V_{CC}$ and the source is connected to the node $N_1$. The drain of the transistor $Q_3$ receives the supply voltage $V_{CC}$ and the gate is connected to the node $N_1$ while the source is connected to the node $N_2$. The drain of the transistor $Q_4$ receives the supply voltage $V_{CC}$ and the gate is connected to the node $N_2$ while the source is connected to an output terminal 13, which is adapted to output the control clock $\phi_{2L}$. The drain of the transistor $Q_5$ receives the supply voltage $V_{CC}$ and the gate is connected to a node $N_3$ while the source is connected to the output terminal 13. The drain of the transistor $Q_6$ receives the supply voltage $V_{CC}$ and the gate is connected to a node $N_4$ while the source is connected to the node $N_3$. The drain of the transistor $Q_7$ receives the inverted precharge clock $\overline{\phi}_{1L}$ and the gate receives the supply voltage $V_{CC}$ while the source is connected to the node $N_4$. The drain of the transistor $Q_8$ receives the supply voltage $V_{CC}$ and the gate receives the precharge clock $\phi_{1L}$ while the source is connected to the node $N_3$. One end of the capacitor $C_1$ is connected to the node $N_1$ while the other end thereof receives in inverted delayed clock $\phi_3'$, which is an inverted delayed signal of a clock $\phi_3$. One end of the capacitor $C_2$ is connected to the node $N_2$ and the other end thereof receives a clamp clock $\phi_{5L}$ which is hereinafter described in detail. One end of the capacitor $C_3$ is connected to the output terminal 13, while the other end thereof receives a clock $\phi_{6L}$ which is also hereinafter described. One end of the capacitor $C_4$ is connected to the node $N_3$ while the other end thereof receives the inverted clock $\overline{\phi}_3$ which is the inverted signal of the clock $\phi_3$. One end of the capacitor $C_5$ is connected to the node $N_4$, while the other end thereof receives the inverted delayed clock $\overline{\phi}_3'$.

A circuit for generating the control clock $\phi_{2R}$ is in similar structure to the circuit for generating the control clock $\phi_{2L}$, except that a precharge clock $\phi_{1R}$ and an inverted precharge clock $\overline{\phi}_{1R}$ are supplied in place of the precharge clock $\phi_{1L}$ and inverted precharge clock $\overline{\phi}_{1L}$ and a clamp clock $\phi_{5R}$ is supplied in place of the clamp clock $\phi_{5L}$ while a clock $\phi_{6R}$ is supplied in place of the clock $\phi_{6L}$.

Figure 5:
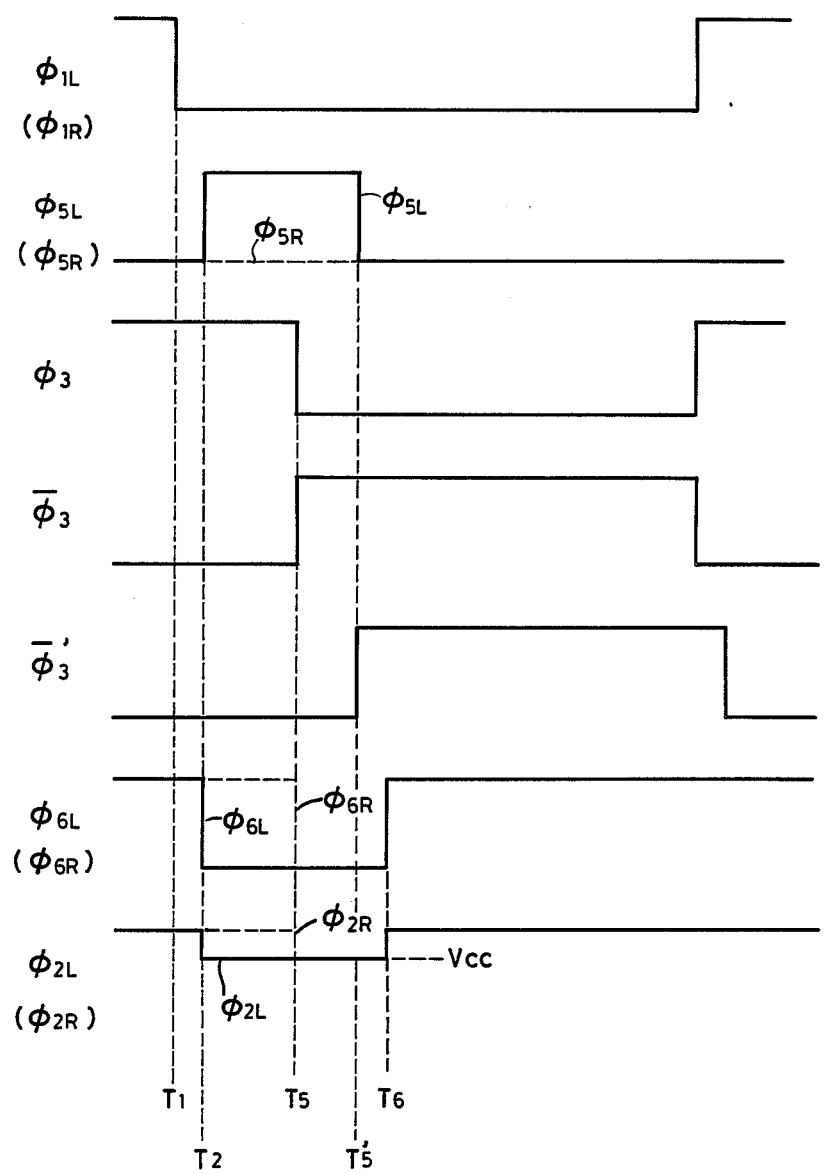
FIG. 5 is a timing chart for illustrating the operation of the circuit as shown in FIG. 4.

FIG. 5 is a timing chart for illustrating the operation of the circuit as shown in FIG. 4. Referring now to FIG. 5, the following description is provided of the operation of the circuit as shown in FIG. 4, in the case where the memory cell on the right side of the sense amplifier is addressed as shown in FIG. 1.

In the standby state to the time $T_1$, the precharge clock $\phi_{1L}$ and clock $\phi_3$ are at high levels, and the output terminal 13 and, thus, the control clock $\phi_{2L}$ are precharged at higher levels than the supply voltage $V_{CC}$ by capacitive coupling of the capacitor $C_3$ as hereinafter described. At this time, the nodes $N_2$ and $N_3$ are precharged at the supply voltage $V_{CC}$ by turning-on of the transistors $Q_1$ and $Q_8$, whereas the transistors $Q_4$ and $Q_5$ remain in OFF states since the potential levels at the sources thereof are higher than those of the gates. Further, the inverted precharge clock $\overline{\phi}_{1L}$ is at a low level, and hence the nodes $N_1$ and $N_4$ are at low levels through the transistors $Q_2$ and $Q_7$ respectively. Therefore, both of the transistors $Q_3$ and $Q_6$ are in OFF states.

At the time $T_1$, the precharge clock $\phi_{1L}$ is turned to a low level and the inverted precharge clock $\overline{\phi}_{1L}$ is turned to a high level, whereby the nodes $N_1$ and $N_4$ are turned to high levels through the transistors $Q_2$ and $Q_7$. Then, at the time $T_2$, the clamp clock $\phi_{5L}$ is turned to a high level whereby the node $N_2$ is boosted by capacitive coupling of the capacitor $C_2$ to a level sufficiently higher than the supply voltage $V_{CC}$. Therefore, the transistor $Q_4$ is strongly turned on and the control clock $\phi_{2L}$ is clamped at a high speed from the high level exceeding the supply voltage $V_{CC}$ to the level of the supply voltage $V_{CC}$. At the same time, the clock $\phi_{6L}$ is also turned to a low level, whereby the level of the control clock $\phi_{2L}$ is pulled in a low level to be clamped at the level of the supply voltage $V_{CC}$ at a higher speed by capacitive coupling of the capacitor $C_3$. At the time $T_5$, the clock $\phi_3$ is turned to a low level and the inverted clock $\overline{\phi}_3$ is turned to a high level whereby the node $N_3$ is boosted to a level sufficiently higher than the supply voltage $V_{CC}$ by capacitive coupling of the capacitor $C_4$. Thus, the transistor $Q_5$ is strongly turned on, whereas no change takes place since the control clock $\phi_{2L}$ is already clamped at the level of the supply voltage $V_{CC}$ in this case. At a time $T_5'$, the inverted delay clock $\overline{\phi}_3'$ is turned to a high level whereby the nodes $N_1$ and $N_4$ are boosted by levels sufficiently higher than the supply voltage $V_{CC}$ by capacitive coupling of the capacitors $C_1$ and $C_5$. Therefore, the transistors $Q_3$ and $Q_6$ are strongly turned on and the nodes $N_2$ and $N_3$ are clamped at the level of the supply voltage $V_{CC}$, whereby the transistors $Q_4$ and $Q_5$ are turned off. Then, at the time $T_6$, the clock $\phi_{6L}$ is again turned to a high level, whereby the control clock $\phi_{2L}$ is turned to a high level exceeding the supply voltage $V_{CC}$ by capacitive coupling of the capacitor $C_3$.

On the other hand, in the circuit for generating the control clock $\phi_{2R}$, the clamp clock $\phi_{5R}$ remains at a low level and the clock $\phi_{6R}$ remains at a high level at the time $T_2$, and hence the node $N_2$ remains at the level of the supply voltage $V_{CC}$ and the control clock $\phi_{2R}$ remains at the high level exceeding the supply voltage $V_{CC}$. At the time $T_5$, the inverted clock $\overline{\phi}_3$ is turned to a high level and the clock $\phi_{6R}$ is turned to a low level, whereby the transistor $Q_5$ is strongly turned on by the capacitor $C_4$ to clamp the control clock $\phi_{2R}$ at the level of the supply voltage $V_{CC}$. Such clamping is made at a higher speed by the function of the capacitor $C_3$. The operation thereafter is substantially identical to that of the circuit for generating the control clock $\phi_{2L}$.

In the case where the memory cell on the left side of the sense amplifier as shown in FIG. 1 is addressed, the operation of the circuit for generating the control clock $\phi_{2L}$ is simply by that of the circuit for generating the control clock $\phi_{2R}$.

As hereinabove described, the control clocks $\phi_{2L}$ and $\phi_{2R}$ which can drive the shared sense amplifier as shown in FIG. 1 at a high speed, are obtained by the circuit as shown in FIG. 4.

Description is now made on an example of structure of a circuit for generating the clamp clock $\phi_{5L}$ ($\phi_{5R}$) supplied to the circuit as shown in FIG. 4. This clamp clock generation circuit is formed by two portions of a $\phi_5$ generation circuit for generating a clamp clock $\phi_5$ in high-speed response to the addressing of the memory cells by the address data and a decode circuit for decoding the clamp clock $\phi_5$ thereby to generate two types of clamp clocks $\phi_{5L}$ and $\phi_{5R}$.

Figure 6:
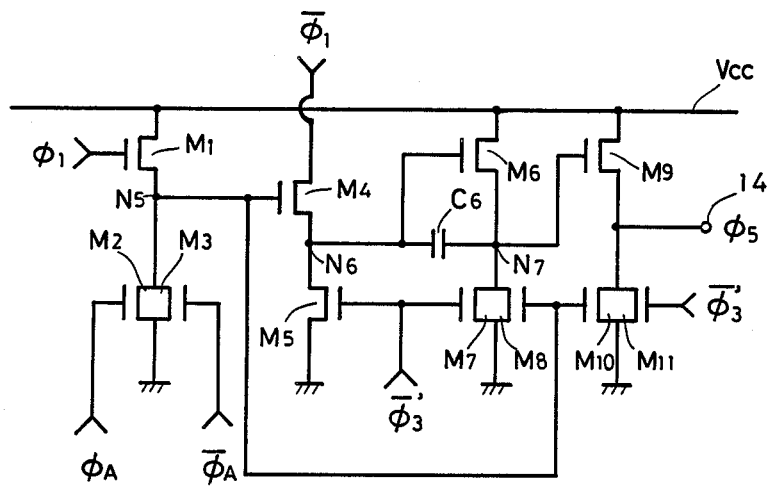
FIG. 6 is a circuit diagram showing another part of the embodiment of the present invention, particularly a circuit for generating clamp clocks.

FIG. 6 is a circuit diagram showing definite arrangement of the aforementioned circuit for generating the clamp clock $\phi_5$. In FIG. 6, the $\phi_5$ generation circuit includes transistors $M_1$ to $M_{11}$ and a capacitor $C_6$. The drain of the transistor $M_1$ receives the supply voltage $V_{CC}$ and the gate receives the precharge clock $\phi_1$ while the source is connected to the node $N_5$. The drain of the transistor $M_2$ is connected to the node $N_5$ and the gate receives a first address clock $\phi_A$ while the source is grounded. The drain of the transistor $M_3$ is connected to the node N while the gate receives a second address clock $\overline{\phi}_A$ and the source is grounded. The drain of the transistor $M_4$ receives an inverted precharge clock $\overline{\phi}_1$ which is an inverted signal of the precharge clock $\phi_1$ and the gate is connected with the node $N_5$ while the source is connected with by node $N_6$. The drain of the transistor $M_5$ is connected with the node $N_6$ and the gate receives the inverted delayed clock $\overline{\phi}_3'$ while the source is grounded. The drain of the transistor $M_6$ receives the supply voltage $V_{CC}$ and the gate is connected to the node $N_6$ while the source is connected to a node $N_7$. The drain of the transistor $M_7$ is connected with the node $N_7$ while the gate receives the inverted delayed clock $\overline{\phi}_3'$ and the source is grounded. The drain of the transistor $M_8$ is connected with the node $N_7$ and the gate is connected with the node $N_5$ while the source thereof is grounded. The drain of the transistor $M_9$ receives the supply voltage $V_{CC}$ while the gate is connected with the node $N_7$ and the source is connected with an output terminal 14, which outputs the clamp clock $\phi_5$. The drain of the transistor $M_{10}$ is connected with the output terminal 14 and the gate is connected with the node $N_5$, while the source is grounded. The drain of the transistor $M_{11}$ is connected with the output terminal 14, while the gate receives the inverted delayed clock $\overline{\phi}_3'$, and the source is grounded. One end of the capacitor $C_6$ is connected with the node $N_6$ and the other end thereof is connected with the node $N_7$.

Either of the precharge clocks $\phi_{1L}$ and $\phi_{1R}$ as shown in FIG. 1 may serve as the precharge clock $\phi_1$. Alternatively, an address strobe signal may be employed in place of the precharge clock $\phi_1$. Further, the first and second address clocks $\phi_A$ and $\overline{\phi}_A'$ are formed by partial bits extracted from the address data for addressing the memory cell, and the first address clock $\phi_A$ indicates addressing of the memory cell on the right side of the sense amplifier in FIG. 1 while the second address clock $\overline{\phi}_A$ indicates addressing of of the memory cell on the left side of the sense amplifier in FIG. 1. In other words, the first address clock $\phi_A$ is turned to a high level when the memory cell on the right side is addressed while the second address clock $\overline{\phi}_A$ is turned to a high level when the memory cell on the left side is addressed.

Figure 7:
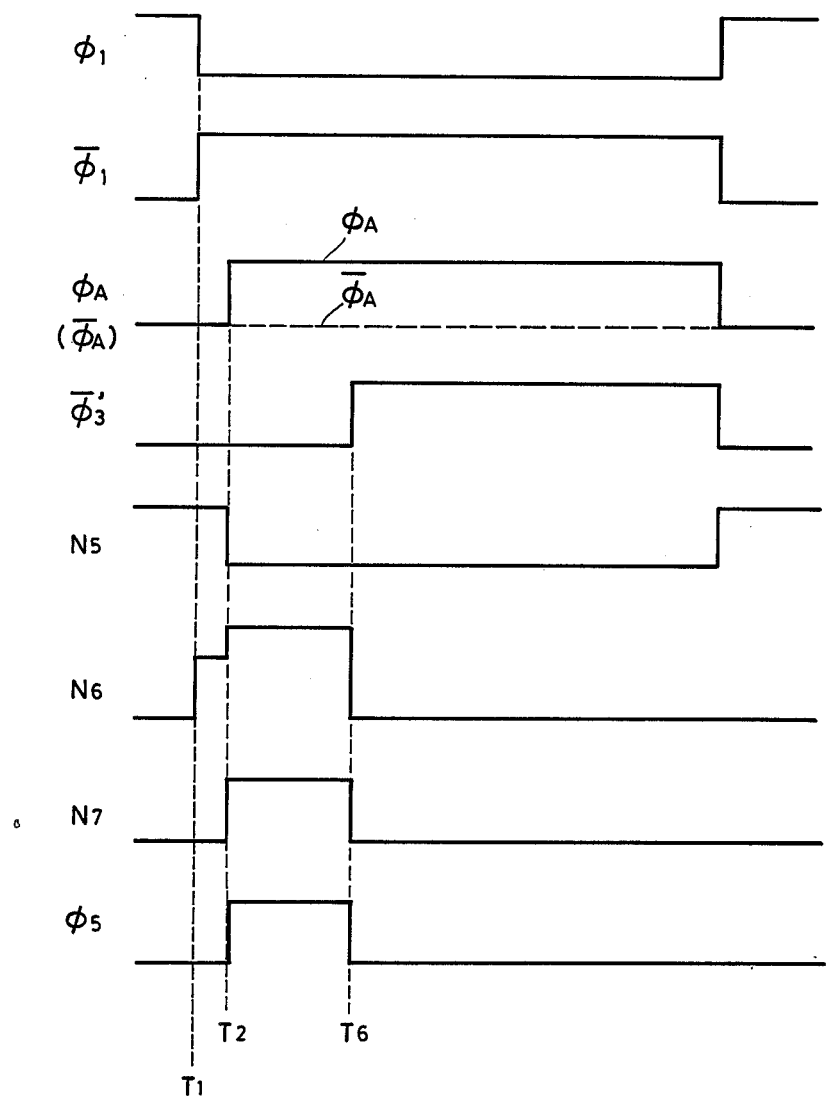
FIG. 7 is a timing chart for illustrating the operation of the circuit as shown in FIG. 6.

FIG. 7 is a timing chart for illustrating the operation of the circuit as shown in FIG. 6. The operation of the circuit in FIG. 6 is now described with reference to FIG. 7. In the standby state to the time $T_1$, the precharge clock $\phi_1$ is at a high level and the node $N_5$ is precharged at a high level through the transistor $M_1$. Therefore, the transistors $M_4$, $M_8$ and $M_{10}$ are in ON states and the nodes $N_6$ and $N_7$ and clamp clock $\phi_5$ are at low levels. At the time $T_1$, the precharge clock $\phi_1$ is turned to a low level and the inverted precharge clock $\overline{\phi}_1$ is turned to a high level whereby the transistor $M_1$ is turned off while the node $N_5$ remains at a high level, and hence the transistor $M_4$ is retained in an ON state. Therefore, the high-level inverted precharge clock $\overline{\phi}_1$ is supplied to the node $N_6$, which is turned to a high level whereby the transistor $M_6$ is turned on. However, since the node $N_5$ remains at a high level, the transistor $M_8$ is retained in an ON state and the node $N_7$ is retained at a low level. At the time $T_2$, either the first or second address clock $\phi_A$ or $\overline{\phi}_A$ is turned to a high level whereby either the transistor $M_2$ or $M_3$ is turned on to turn the node $N_5$ to a low level. Therefore, the transistor $M_4$ is turned off and the node $N_6$ enters a high floating state. On the other hand, the transistors $M_8$ and $M_{10}$ are turned off whereby the level of the node $N_7$ begins to be increased. Then the node $N_6$ is boosted to a higher level by capacitive coupling of the capacitor $C_6$, whereby the transistor $M_6$ is strongly turned on to increase the voltage at the node $N_7$ to the level of the supply voltage $V_{CC}$ at a high speed. Thus, the transistor $M_9$ is turned on to turn the clamp clock $\phi_5$ to a high level at a high speed. Then, at the time $T_6$, the inverted delayed clock $\overline{\phi}_3'$ is turned to a high level, whereby the transistors $M_5$, $M_7$ and $M_{11}$ are turned on to turn the nodes $N_6$ and $N_7$ and clamp clock $\phi_5$ to low levels. Although the inverted delayed clock $\overline{\phi}_3'$ is employed in this embodiment to reset the circuit, such reset operation may be performed by other types of reset clocks.

According to the circuit of FIG. 6 as hereinabove described, generated is the clamp clock $\phi_5$ which responds at a high speed to the first or second address clock $\phi_A$ or $\overline{\phi}_A$.

Figure 8:
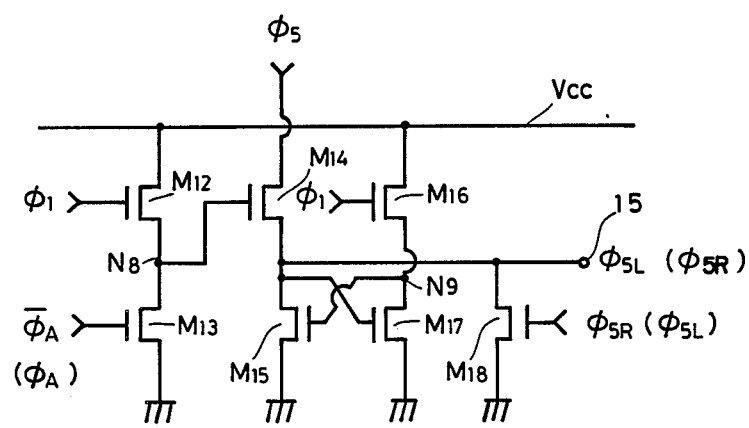
FIG. 8 is a circuit diagram showing still another part of the embodiment of the present invention, particularly a decode circuit for decoding the clamp clocks outputted from the circuit as shown in FIG. 6 to that shown in FIG. 4.

FIG. 8 shows an example of the aforementioned decode circuit, particularly a circuit for producing the clamp clock $\phi_{5L}$. The circuit as shown in FIG. 8 includes transistors $M_{12}$ to $M_{18}$. The drain of the transistor $M_{12}$ receives the supply voltage $V_{CC}$ while the gate receives the precharge clock $\phi_1$ and the source is connected with a node $N_8$. The drain of the transistor $M_{13}$ is connected to the node $N_8$ while the gate receives a second address clock $\overline{\phi}_A$ and the source is grounded. The drain of the transistor $M_{14}$ receives the clamp clock $\phi_5$ from the circuit as shown in FIG. 6 while the gate is connected with the node $N_8$ and the source is connected with an output terminal 15, which outputs the clamp clock $\phi_{5L}$. The drain of the transistor $M_{15}$ is connected with the output terminal 15 and the gate is connected with a node $N_9$ while the source is grounded. The drain of the transistor $M_{16}$ receives the supply voltage $V_{cc}$ and the gate receives the precharge clock $\phi_1$ while the source is connected with node $N_9$. The drain of the transistor $M_{17}$ is connected with the node $N_9$ and the gate is connected with the output terminal 15 while the source is grounded. The drain of the transistor $M_{18}$ is connected with the output terminal 15 while the gate receives a clamp clock $\phi_{5R}$ and the source is grounded.

A circuit for producing the clamp clock $\phi_{5R}$ (similarly included in the decode circuit) is in similar structure to the aforementioned circuit as shown in FIG. 8, except that the first address clock $\phi_A$ is supplied in place of the second address clock $\overline{\phi}_A$ and the clamp clock $\phi_{5L}$ is supplied in place of the clamp clock $\phi_{5R}$.

Figure 9:
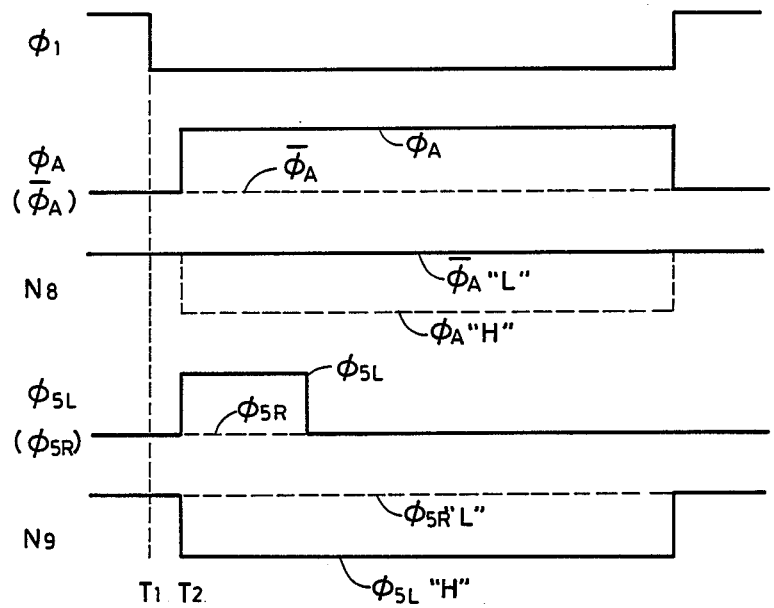
FIG. 9 is a timing chart for illustrating the operation of the circuit as shown in FIG. 8.

FIG. 9 is a timing chart for illustrating the operation of the circuit as shown in FIG. 8. The operation of the circuit in FIG. 8 is now described with reference to FIG. 9, on such case that the memory cell on the right side of the sense amplifier in FIG. 1 is addressed.

In the standby state to the time $T_1$, the precharge clock $\phi_1$ is at a high level. Therefore, the transistors $M_{12}$ and $M_{16}$ are in ON states and the nodes $N_8$ and $N_9$ are precharged at high levels. Thus, the transistors $M_{14}$ and $M_{15}$ are turned on and the output terminal 15 and, thus, the clamp clock $\phi_{5L}$ are at low levels. If the memory cell on the right side in FIG. 1 is addressed at the time $T_2$, the first address clock $\phi_A$ is turned to a high level while the second address clock $\overline{\phi_A}$ remains at a low level. Therefore, the node $N_8$ is retained at a high level at the time $T_2$, thereby to retain the transistor $M_{14}$ in an ON state. Thus, the level of the clamp clock $\phi_5$ is directly transmitted to the output terminal 15, and the clamp clock $\phi_{5L}$ presents the same waveform as that of the clamp clock $\phi_5$. At this time, the transistor $M_{17}$ is turned on to turn the node $N_9$ to a low level, whereby the transistor $M_{15}$ is in an OFF state.

On the other hand, in the circuit for producing the clamp clock $\phi_{5R}$, the first address clock $\phi_A$ rises to a high level at the time $T_2$, whereby the transistor $M_{13}$ is turned on and the node $N_8$ is turned to a low level while the transistor $M_{14}$ is cut off. Thus, the level of the clamp clock $\phi_5$ is not transmitted to the output terminal 15, and the transistor $M_{17}$ is not turned on. Therefore, the transistor $M_{15}$ remains in an ON state and the clamp clock $\phi_{5R}$ is retained at a low level. Further, during the period when the clamp clock $\phi_{5L}$ is at a high level, the transistor $M_{18}$ is in an ON state whereby the clamp clock $\phi_{5R}$ is securely retained at a low level state at least in the high-level period of the clamp clock $\phi_{5L}$.

In the case where the memory cell on the left side of the circuit as shown in FIG. 1 is selected, the operation of the circuit for producing the clamp clock $\phi_{5L}$ is simply replaced by the operation of that for producing the clamp clock $\phi_{5R}$.

Figure 10:
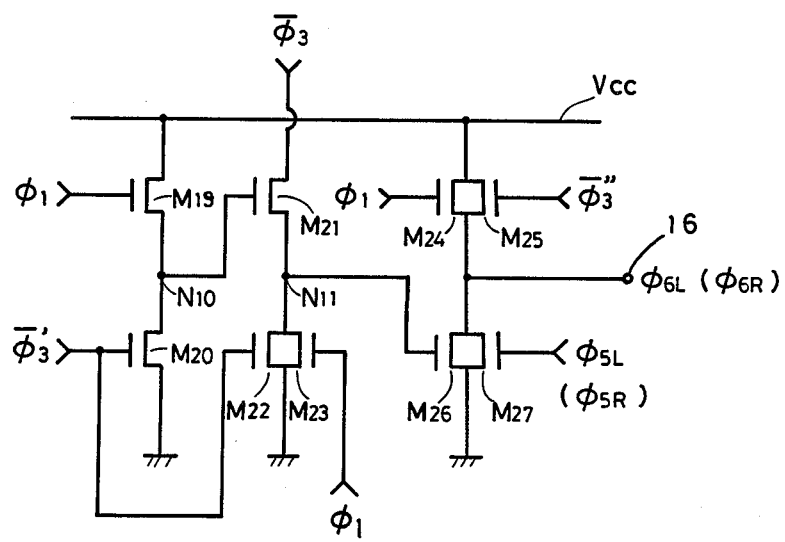
FIG. 10 is a circuit diagram showing a further part of the embodiment of the present invention, particularly a circuit for generating clocks for driving the circuit as shown in FIG. 4.

Description is now made on an example of structure of a circuit for generating the clock $\phi_{6L}$ supplied to the circuit as shown in FIG. 4. FIG. 10 shows the circuit for generating the clock $\phi_{6L}$. The circuit as shown in FIG. 10 includes transistors $M_{19}$ to $M_{27}$. The drain of the transistor $M_{19}$ receives the supply voltage $V_{CC}$ and the gate receives the precharge clock $\phi_1$ while the source is connected to a node $N_{10}$. The drain of the transistor $M_{20}$ is connected with the node $N_{10}$ while the gate receives the inverted delayed clock $\overline{\phi_3}'$ and the source is grounded. The drain of the transistor $M_{21}$ receives the inverted clock $\overline{\phi_3}$ while the gate is connected with the node $N_{10}$ and the source is connected with a node $N_{11}$. The drain of the transistor $M_{22}$ is connected with the node $N_{11}$ while the gate receives the inverted delayed clock $\overline{\phi_3}'$ and the source is grounded. The drain of the transistor $M_{23}$ is connected with the node $N_{11}$ while the gate receives the precharge clock $\phi_1$ and the source is grounded. The drain of the transistor $M_{24}$ receives the supply voltage $V_{CC}$ and the gate receives the precharge clock $\phi_1$ while the source is connected with an output terminal 16, which outputs the clock $\phi_{6L}$. The drain of the transistor $M_{25}$ receives the supply voltage $V_{CC}$ and the gate receives an inverted delayed clock $\overline{\phi_3}''$ and the source is connected with the output terminal 16. The drain of the transistor $M_{26}$ is connected with the output terminal 16 and the gate is connected with the node $N_{11}$ while the source is grounded. The drain of the transistor $M_{27}$ is connected with the output terminal 16 while the gate receives the clamp clock $\phi_{5L}$ and the source is grounded., The inverted delayed clock $\overline{\phi_3}''$ is obtained by delaying the inverted delayed clock $\overline{\phi_3}'$ further by a prescribed time.

On the other hand, a circuit for generating the clock $\phi_{6R}$ is in similar arrangement to that of the circuit as shown in FIG. 10, except that the clamp clock $\phi_{5R}$ is supplied in place of the clamp clock $\phi_{5L}$.

Figure 11:
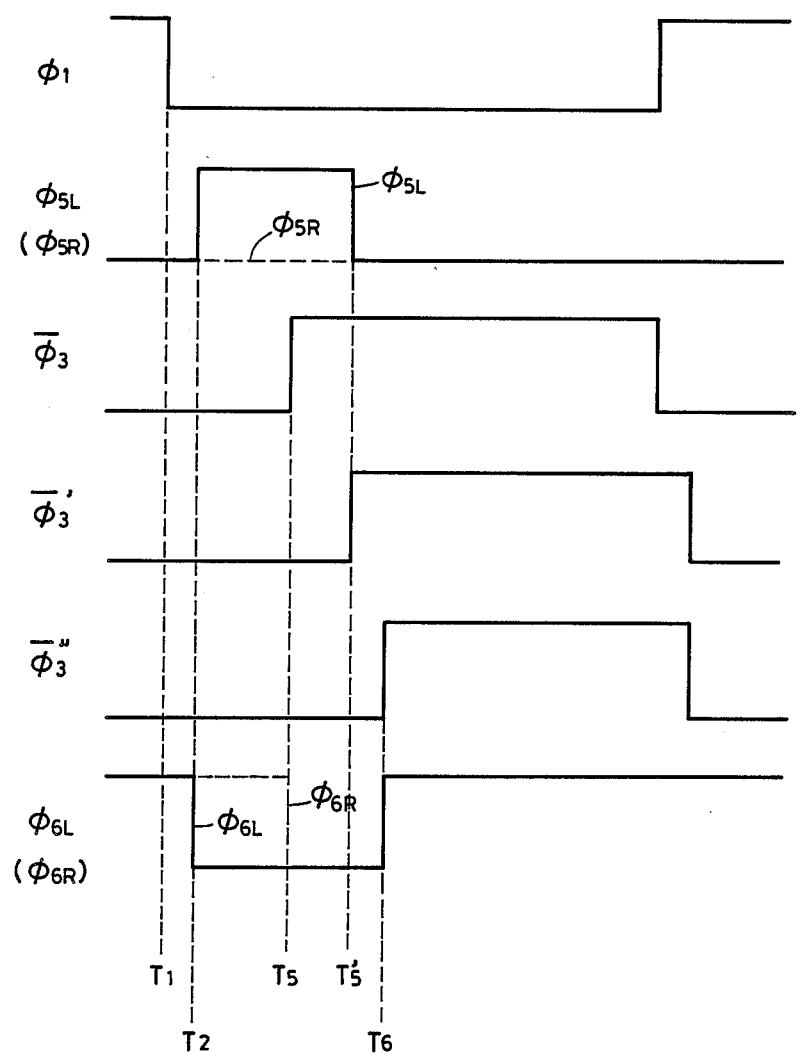
FIG. 11 is a timing chart for illustrating the operation of the circuit as shown in FIG. 10.

FIG. 11 is a timing chart for illustrating the operation of the circuit as shown in FIG. 10. The operation of the circuit in FIG. 10 is now described with reference to FIG. 11.

In the standby state to the time $T_1$, the precharge clock $\phi_1$ is at a high level and all of the transistors $M_{19}$, $M_{23}$ and $M_{24}$ are in ON states. Therefore, the node $N_{10}$ is at a high level and the node $N_{11}$ is at a low level, while the output terminal 16 and, thus, the clock $\phi_{6L}$ are at high levels. At the time $T_1$, the precharge clock $\phi_1$ is turned to a low level, whereby all of the transistors $M_{19}$, $M_{23}$ and $M_{24}$ are turned off while all of the nodes $N_{10}$ and $N_{11}$ and output terminal 16 enter floating states and no change is caused in the potential levels. At the time $T_2$, the clamp clock $\phi_{5L}$ is turned to a high level, whereby the transistor $M_{27}$ is turned on to turn the output terminal 16 to a low level, whereby the clock $\phi_{6L}$ is turned to a low level. Then, at the time $T_5$, the clock $\phi_3$ is turned to a low level and the inverted clock $\overline{\phi_3}$ is turned to a high level, and since the node $N_{10}$ is at a high level, the node $N_{11}$ is turned to a high level through the transistor $M_{21}$. Therefore, the transistor $M_{26}$ is turned on, while no change is caused in the clock $\phi_{6L}$ since the output terminal 16 is already at a low level. At the time $T_5'$, the inverted delayed clock $\overline{\phi_3}'$ is turned to a high level and the clamp clock $\phi_{5L}$ is turned to a low level whereby the transistors $M_{20}$ and $M_{22}$ are turned on and the transistor $M_{27}$ is turned off. Therefore, the nodes $N_{10}$ and $N_{11}$ are turned to low levels, whereby the transistors $M_{21}$ and $M_{26}$ are turned off. At the time $T_6$, the inverted delayed clock $\overline{\phi_3}''$ is turned to a high level, whereby the transistor $M_{25}$ is turned on to again turn the output terminal 16 to a high level. Therefore, the clock $\phi_{6L}$ is turned to a high level.

On the other hand, in the circuit for generating the clock $\phi_{6R}$, the clamp clock $\phi_{5R}$ remains at a low level at the time $T_2$, and hence the clock $\phi_{6R}$ remains at a high level. At the time $T_5$, the inverted clock $\overline{\phi_3}$ is turned to a high level, whereby the transistor $M_{26}$ is turned on to turn the output terminal 16 and, thus, the clock $\phi_{6R}$ to low levels. The operation thereafter is substantially identical to that of the circuit as shown in FIG. 10.

According to the circuit of FIG. 10 as hereinabove described, generated is the clock $\phi_{6L}$ ($\phi_{6R}$) required for driving the circuit as shown in FIG. 4.

The driving circuit for a shared sense amplifier according to the embodiment of the present invention is formed by the aforementioned circuits as shown in FIGS. 4, 6, 8 and 10, thereby to generate the control clock $\phi_{2L}$ ($\phi_{2R}$) which can drive the shared sense amplifier at a high speed.

Although the aforementioned description has been made on a shared sense amplifier employing folded bit lines, open bit lines may be employed in place of the same. In this case, the bit lines $3_L$ and $3_R$ in FIG. 1 are taken as a pair of open bit lines and the bit lines $4_L$ and $4_R$ are taken as another pair of open bit lines while a clock corresponding to the control clock $\phi_{2L}$ is inputted in the gates of the transfer transistors $7_L$ and $7_R$ and a clock corresponding to the control clock $\phi_{2R}$ is inputted in the gates of the transfer transistors $8_L$ and $8_R$. Alternatively, the bit lines $3_L$ and $4_R$ may be taken as a pair of open bit lines while taking the bit lines $3_R$ and $4_L$ as another pair of open bit lines and inputting a clock corresponding to the control clock $\phi_{2R}$ in the gates of the transfer transistors $7_L$ and $8_R$ and a clock corresponding to the control clock $\phi_{2R}$ in the gates of the transfer transistors $8_L$ and $7_R$.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A driving circuit for a shared sense amplifier which drives at a high speed a shared sense amplifier circuit including two pairs of it lines ($3_R$, $4_R$ and $3_L$, $4_L$) respectivey connected with memory cells ($MC_{1R}$, $MC_{NR}$ and $MC_{1L}$, $MC_{NL}$), a sense amplifier (1, 2) provided between said two pairs of bit lines for amplifying information read from said memory cells, a first transfer transistor group ($7_R$, $8_R$ or $7_L$, $8_L$) interposed between one of said pairs of bit lines ($3_R$, $4_R$ or $3_L$, $4_L$) and said sense amplifier and a secnd transfer transistor group ($7_L$, $8_L$ or $7_R$, $8_R$) interposed between the other pair of bit lines ($3_L$, $4_L$ or $3_R$, $4_R$) and said sense amplifier (1, 2) thereby to share said sense amplifier by said two pairs of bit lines ($3_R$, $4_R$ and $3_L$, $4_L$), said driving circuit comprising:
   a clamp clock generation circuit for generating a clamp clock ($\phi_5$) respondig at a high speed to addressing of said memory cells;
   a decoder for decoding said clamp clock ($\phi_5$); and
   on-off control means for controlling on-off operations of said first and second transfer transistor groups on the basis of an output from said decoder,
   said on-off control means including clamp means for clamping, upon addressing of any one of said memory calls, the gate voltage of said transfer transistor group interposed between the pair of bit lines not connected with said addressed memory cell and said sense amplifier, said gate voltage equal to the precharge voltage of said bit lines thereby to turn off said transfer transistor group.

2. A driving circuit for a shared sense amplifier in accordance with claim 1, wherein said on-off control means includes means for setting, in a standby state before said addressing of said memory cells, the gate voltage levels of respective transfer transistor groups to be higher than a respectie total of precharge voltage levels of said bit lines and threshold voltage levels of said transfer transistor groups thereby to turn on said respective transfer transistor groups.

3. A driving circuit for a shared sense amplifier in accordance with claim 1, wherein said two pairs of bit lines are formed by folded bit lines ($3_R$, $4_R$ and $3_L$, $4_L$) respectively.

4. A driving circuit for a shared sense amplifier in accordance with claim 1, wherein said two pairs of bit lines are formed by open bit lines respectively.

5. A driving circuit for a shared sense apmplifier in accordance with claim 1, wherein said clamp clock generation circuit includes:
   a first potential level source ($V_{cc}$),
   a second potential level (ground) source having a potential level different from that of said first potential level source,
   a first transistor ($M_6$) having a first conducting terminal connected with said first potential level source,
   a second transistor ($M_8$) interposed between a second conducting terminal of said first transistor and said second potential level source,
   first circuit means ($M_1$–$M_4$) for making said first transistor conductive and said second transistor non-conductive in response to said addressing of said memory cell,
   boostsing capacitor means ($C_6$) inerposed between said second conducting terminal of said first transistor and the gate terminal of said first transistor for making said first transistor conductive at a high speed, and
   second circuit means ($M_9$) for producing said clamp clock ($\phi_5$) on the basis of change in potential at said second conducting terminal of said first transistor.

6. A driving circuit for a shared sense amplifier in accordance with claim 1, wherein said on-off control means includes first transistor means connected to the precharge voltage of said bit lines and responsive to a precharge clock signal for said bit lines, further transistor means responsive to clock signals for activating and deactivating the sense amplifier, and output transistor means responsive to said further transistor means and to said first transitor means for outputting a control clock signal for controlling operations of said first and second transfer transistor groups.

7. A driving circuit for a shared sense amplifier in accordance with claim 6, wherein said output transistor means comprises a pair of parallel connected transistors having gates connected to outputs of said first transistor means, a first of said pair of output transistors connected to said clamp clock signal and operable or responding to initiation of said clamp clock signal to clamp the transfer transistor groups for the nonselected bit lines to said precharge voltage level, thereby to turn off said transfer transistor group,
   a second of said pair of putput transistors connected to said clock signals for said sense amplifier and operable in response to said clock signals for sais sense amplifier to continue to clamp said transfer transistor group to said precharge voltagae after termination of said clamp clock signal.

8. A driving circuit for a shares sense amplifier in accordance with claim 7, wherein said further transistor means is connected to receive a delayed invereted form of said clock signal for said sense amplifier and operable in response thereto for providing to said output transistors a gate signal for turning off said output transistors.

9. A driving circuit for a shared sense amplifier in accordance with claim 8, further comprising means responsive to a level raising clock signal for providing to the gates of said transfer transistor group a voltage level for turning on said transfer transistor group subsequent to turning off of said output transistors.

10. In a driving circuit for a shared sense amplifier which drives at a high speed a shared sense amplifier circuit including two pairs of bit lines ($3_R$, $4_R$ and $3_L$, $4_L$) respectively connected with memory cells ($MC_{1R}$, $MC_{NR}$ and $MC_{1L}$, $MC_{NL}$), a sense amplifier (1, 2) provided between said two pairs of bit lines for amplifying information read from said memory cells, a first transfer transistor group ($7_R$, $8_R$ or $7_L$, $8_L$) interposed between one of said pairs of bit lines ($3_R$, $4_R$ or $3_L$, $4_L$) and said sense amplifier and a second transfer transistor group ($7_L$, $8_L$ or $7_R$, $8_R$) interposed between the other pair of bit lines ($3_L$, $4_L$ or $3_R$, $4_R$) and said sense amplifier (1, 2) thereby to share said sense amplifier by said two pairs of bit lines ($3_R$, $4_R$ and $3_L$, $4_L$), the improvemet comprising:
   on-off control means for controlling on-off operations of said first and second transfeer transistor groups based on an output from a decoder for decoding a clamp clock signal, said on-off control means including clamp means, operable upon addressing of one of said memory cells, connected to said sense amplifier by one pair of bit lines, for disconnecting from the sense amplifier the other pair of bit lines connected between a non-addressed memory cell and the sense amplifier, said claiming means operable for disconnecting the other pair of bit lines by clamping the gate voltage of the transfer transistor group connecting the other pair of bit lines to the sense amplifier too the precharge voltage level for the bit lines.

* * * * *

UNITED STATES PATENT AND TRADEMARK OFFICE
CERTIFICATE OF CORRECTION

PATENT NO. : 4,710,901

DATED : December 1, 1987

INVENTOR(S) : Masaki Kumanoya; Kazuyasu Fujishima; Katsumi Dosaka; Hideto Hidaka, Hideshi Miyatake, Tsutomu Yoshihara It is certified that error appears in the above-identified patent and that said Letters Patent is hereby corrected as shown below:

On the title page inventor should read

-- [75] Inventors: Masaki Kumanoya; Kazuyasu Fujishima; Katsumi Dosaka; Hideto Hidaka; Hideshi Miyatake; Tsutomu Yoshihara, all of Itami, Japan --.

Signed and Sealed this

Twenty-fourth Day of May, 1988

*Attest:*

*Attesting Officer*

DONALD J. QUIGG

*Commissioner of Patents and Trademarks*